United States Patent
Brochhaus

(10) Patent No.: US 9,702,941 B2
(45) Date of Patent: Jul. 11, 2017

(54) METHOD AND DEVICES FOR MAKING AVAILABLE INFORMATION FOR THE PURPOSE OF PERFORMING MAINTENANCE AND SERVICING OF A BATTERY

(71) Applicants: Robert Bosch GmbH, Stuttgart (DE); Samsung SDI Co., Ltd., Yongin-si, Gyeonggi-do (KR)

(72) Inventor: Christoph Brochhaus, Aachen (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 579 days.

(21) Appl. No.: 14/279,464

(22) Filed: May 16, 2014

(65) Prior Publication Data

US 2014/0350876 A1  Nov. 27, 2014

(30) Foreign Application Priority Data

May 22, 2013  (DE) .......................... 10 2013 209 433

(51) Int. Cl.
    *G01R 31/36* (2006.01)
(52) U.S. Cl.
    CPC ...... *G01R 31/3651* (2013.01); *G01R 31/3606* (2013.01); *G01R 31/3679* (2013.01)
(58) Field of Classification Search
    CPC ............ G01R 31/3651; G01R 31/3679; G01R 31/3605; G01R 31/3658; B60L 11/1864; Y02T 10/7061; Y02T 10/7005; Y02T 10/7011; Y10T 307/352
    USPC ......... 702/63; 340/455, 635, 636.1; 358/2.1, 358/3.24, 518

See application file for complete search history.

(56) References Cited

U.S. PATENT DOCUMENTS

| | | | | |
|---|---|---|---|---|
| 4,679,000 A | * | 7/1987 | Clark | H02J 7/0078 320/136 |
| 5,117,293 A | * | 5/1992 | Asada | H04N 1/6027 358/2.1 |
| 5,552,999 A | | 9/1996 | Polgreen et al. | |

(Continued)

FOREIGN PATENT DOCUMENTS

| | | |
|---|---|---|
| DE | 195 40 827 A1 | 5/1996 |
| DE | 10 2010 031 337 A1 | 1/2012 |
| WO | 2006/048125 A1 | 5/2006 |

*Primary Examiner* — Carol S Tsai
(74) *Attorney, Agent, or Firm* — Maginot, Moore & Beck LLP

(57) ABSTRACT

A method makes available information for the purpose of performing maintenance and servicing of a battery, which includes at least one battery module with an assigned module control device and a central control device, wherein at least one module control device has a non-volatile memory. The method comprises detecting and quantizing useful data of battery units, forming a histogram which has frequency values of the occurrence of specific values of the individual quantized useful data or values derived therefrom, transferring the histogram from the central control device to a module control device, and storing the histogram in the non-volatile memory of the module control device. Furthermore, a computer program and a battery management system are specified which are configured to execute the method, as well as a battery and a motor vehicle whose drive system is connected to a battery of this type.

5 Claims, 6 Drawing Sheets

(56) References Cited

U.S. PATENT DOCUMENTS

| | | | |
|---|---|---|---|
| 7,772,799 B2* | 8/2010 | Wu | B60L 3/0046 |
| | | | 320/104 |
| 2010/0185048 A1* | 7/2010 | Lonky | A61M 1/0031 |
| | | | 600/37 |
| 2016/0321529 A1* | 11/2016 | Rujan | G06K 7/1417 |

* cited by examiner

METHOD AND DEVICES FOR MAKING AVAILABLE INFORMATION FOR THE PURPOSE OF PERFORMING MAINTENANCE AND SERVICING OF A BATTERY

This application claims priority under 35 U.S.C. §119 to patent application no. DE 10 2013 209 433.7, filed on May 22, 2013 in Germany, the disclosure of which is incorporated herein by reference in its entirety.

The disclosure relates to a method for making available information for the purpose of performing maintenance and servicing of a battery which comprises a plurality of battery units, wherein useful data of the battery units are detected and quantized, and wherein histograms are formed which have frequency values of the occurrence of specific values of the individual quantized useful data or values derived therefrom.

Furthermore, a computer program and a battery management system are specified which are configured, in particular, to execute the methods. Furthermore, a battery and a motor vehicle are specified with a battery of this type.

BACKGROUND

Electronic control devices are used nowadays in increasing numbers in the field of automobiles. Examples of this are engine control devices and control devices for ABS systems and airbags. For electrically driven vehicles a current focus of research is the development of high-performance battery packs with associated battery management systems, i.e. control devices, which are equipped with software for monitoring the functionality of the battery. Battery management systems ensure, inter alia, safe and reliable functioning of the battery cells and battery packs which are used. They monitor and control currents, voltages, temperatures, insulation resistances and further variables for individual cells and/or the entire battery pack. By using these variables it is possible to implement management functions which increase the service life, reliability and safety of the battery system.

DE 10 2010 031 337 A1 presents a method for determining the expected service life of battery cells. To this end, physical variables and/or the number of executions of processes which take place in the battery cells are determined for a plurality of operating cycles and the frequency of the occurrence of specific values of the physical variable and/or the frequency of the number of executions of at least one specific process are/is stored. As a result, cell defects, inter alia, can be detected early and prevented, and precise knowledge about the expected service life of the battery cell can be acquired.

SUMMARY

According to a first aspect, a method according to the disclosure for making available information for the purpose of performing maintenance and servicing of a battery which comprises at least one battery module with an assigned module control device and a central control device, wherein at least one module control device has a non-volatile memory, comprises the following steps:
a) detecting and quantizing useful data of battery units;
b) forming a histogram which has frequency values of the occurrence of specific values of the individual quantized useful data or values derived therefrom;
c) transferring the histogram from the central control device to a module control device; and
d) storing the histogram in the non-volatile memory of the module control device.

In the methods according to the disclosure the history of the use of the battery is advantageously recorded, which history can be read out and used both within the scope of warranty claims and for evaluating the use of the battery, for example for determining the expected service life or the state of health (SOH) of the battery unit. In this context, histograms are formed, wherein the histograms have numbers of detection processes, which can be assigned to the individual quantized useful data, of the respective quantized useful data item or values derived therefrom. Histograms are particularly advantageously suitable for determining the service life and the state of the health and age of the battery unit. By using a counter for the driving cycles it is also possible to draw conclusions about the average use of the battery unit per driving cycle. As a result, the histogram provides a total overview of the use of the battery during the previous service life. Within the scope of warranty claims, the histogram can also be read out of the non-volatile memory of the respective control device and used to evaluate the use of the battery.

Derived values can designate, for example, relative frequencies, systematic shifting or weighting of the detection processes of the useful data which are suitable for increasing the informative power or comparison force of the detected useful data.

The quantization of the detected useful data denotes that reference points are defined which each represent boundaries of intervals, and the detected useful data is assigned to the intervals. The intervals here may be defined with different sizes or in a regular fashion. For example, a temperature range can be defined between −40° C. and +80° C. and divided into intervals of 10° C., 5° C., 2° C. or 1° C. In terms of the size and number of the intervals, on the one hand the memory which is taken up by the histogram is taken into account and, on the other hand, the informative power of the detected useful data quantized in this way is taken into account.

The updating of the histogram is carried out after each driving cycle. A histogram therefore comprises the frequency values of the occurrence of specific values of the individual quantized useful data of the last driving cycle and of the previous driving cycles. The events which trigger a start and an end of the driving cycle may be, for example, charging pulses, a change of state of the battery from "operation" (drive) to "charging" (charge), evaluation of a signal "charging active" or else evaluation of a state of change at a terminal 15, i.e. of the ignition positive. Likewise, the event which triggers the start and the end of the driving cycle can be defined by detecting what is referred to as battery balancing. The driving cycle can be defined, for example, in such a way that it also comprises a subsequent charging process or does not comprise said process.

During the driving cycle, a current histogram is preferably produced in the volatile memory of the central control device. After the driving cycle, the current histogram and existing histograms are combined to form updated histograms and stored in the non-volatile memory of the module control device. Such a non-volatile memory is, for example, what is referred to as an EEPROM, i.e. a programmable read-only memory which can be deleted electrically.

According to one preferred embodiment, in order to implement step d) an existing histogram is loaded from the non-volatile memory of the module control device, and the histogram which is received by the central control device and the existing histogram are combined to form an updated histogram and are stored in the non-volatile memory of the module control device.

According to a further preferred embodiment there is provision that the method comprises the step:

e) storing a total histogram in a non-volatile memory of the central control device.

There is provision here that before, during or after the driving cycle an existing histogram is loaded from the non-volatile memory of the central control device, the current histogram and the loaded existing histogram are combined to form an updated histogram, and the updated histogram is stored in the non-volatile memory of the central control device.

According to one preferred embodiment there is provision that when an old battery module is replaced with a new battery module, the new battery module is initialized with an empty histogram.

A detection rate of the useful data of the battery unit has, according to one preferred embodiment, a defined value between 6/s and 6/h, preferably between 1/s and 1/min, particularly preferably 6/min or 1/min. After the defined time intervals, for example the current temperature and the current voltage of the cells are noted in the histogram. For measured values such as the temperature and SOC, further preferred sampling rates can be between 1/min and 6/h, in particular approximately 1/min. For voltages, a filtered value is preferably stored, for example a mean value over a defined time period, wherein preferred time periods are also approximately 1 min. The detection rate of the respective useful data of the battery unit is preferably in a range which assists on-board diagnostics (OBD).

The useful data of the battery comprise, for example, the temperature, the state of charge, the current which is output or the voltage which is made available. Likewise, useful data can comprise variables derived therefrom, for example variables which are summed or integrated over time, variables which are multiplied with one another or aggregated in some other way, such as, for example, also what is referred to as the state of health (SOH) of the battery in suitable quantifiable units. Furthermore, difference values between minimum and maximum states, for example of states of charge, relative battery powers or number of executions of charging and discharging cycles can be included in the useful data.

The presented method can be applied, in particular, in lithium-ion batteries and in nickel metal hybrid batteries. It is preferably used in a plurality of cells and in particular in all the cells of one or more batteries which are operated essentially simultaneously.

According to the disclosure, a computer program is also proposed according to which one of the methods described herein is executed when the computer program is run on a programmable computer device. The computer program can be, for example, a module for implementing a device for making available or for reading out information for the purpose of performing maintenance and servicing of a battery unit and/or a module for implementing a battery management system of a vehicle. The computer program can be stored on a machine-readable storage medium, for example on a permanent or re-writable storage medium or with an assignment to a computer device, for example on a portable memory such as a CD-ROM, DVD, a USB stick or a memory card. Additionally or alternatively to this, the computer program can be provided for downloading on a computer device, such as on a server or a cloud server, for example by means of a data network such as the Internet or a communication link such as, for example, a telephone line or a wireless link.

According to the disclosure, a battery management system (BMS) is also made available with a unit for detecting and quantizing useful data of a battery unit, a unit for producing or updating a histogram which has frequency values of the occurrence of specific values of the individual quantized useful data or values derived therefrom, a unit for transferring the histogram from the central control device to the module control device and a unit for storing the histogram in a non-volatile memory of the module control device.

A further unit for storing the histogram in a non-volatile memory can also be arranged on the side of a central control device (BCU).

According to the disclosure, a battery, in particular a lithium-ion battery or a nickel-metal hydride battery, is made available which comprises a battery management system and can be connected to a drive system of a motor vehicle, wherein the battery management system is, as described above, designed and/or configured to carry out the method according to the disclosure.

The terms "battery" and "battery unit" are used in the present description in a way which is adapted to the customary usage for an accumulator or an accumulator unit. The battery preferably comprises one or more battery units which can comprise a battery cell, a battery module, a module section or a battery pack. The battery cells are preferably spatially combined here and connected to one another by means of circuit technology, for example serially or in a parallel fashion to form modules. A plurality of modules can form what are referred to as battery direct converters (BDC) and a plurality of battery direct converters can form a battery direct inverter (BDI).

According to the disclosure, a motor vehicle with a battery of this type is also made available, wherein the battery is connected to a drive system of the motor vehicle. The method is preferably applied in electrically driven vehicles in which a plurality of battery cells are connected together in order to make available the necessary drive voltage.

Decentralized storage of the information in module control devices is advantageously proposed. In the case of damage claims/warranty claims the histogram can be read out both from the non-volatile memory of the central control device and from the non-volatile memories of the individual module control devices and used to evaluate the use of the battery. The entire use of the battery can be evaluated by means of the total histogram which covers the entire service life and which is stored in the central control device. Additionally, the use histograms of the modules can be read out and analyzed. For this purpose, the central module control device is in principle not necessary. The replacement of modules also has no influence on the histograms of the other modules.

A further advantage is obtained through the scalability of the system. The number of detected measurement variables, i.e. the dimensions of the histogram, can be extended as desired. It is therefore possible to use high-dimensional histograms which make available, for example, information as to how long a battery was used with a specific combination of a defined state of charge, a defined temperature and a defined current flow. The method can also be applied in parallel on various independent histograms.

BRIEF DESCRIPTION OF THE DRAWINGS

Exemplary embodiments of the disclosure are illustrated in the drawings and explained in more detail in the following description. In the drawings.

DETAILED DESCRIPTION

Figure 1:
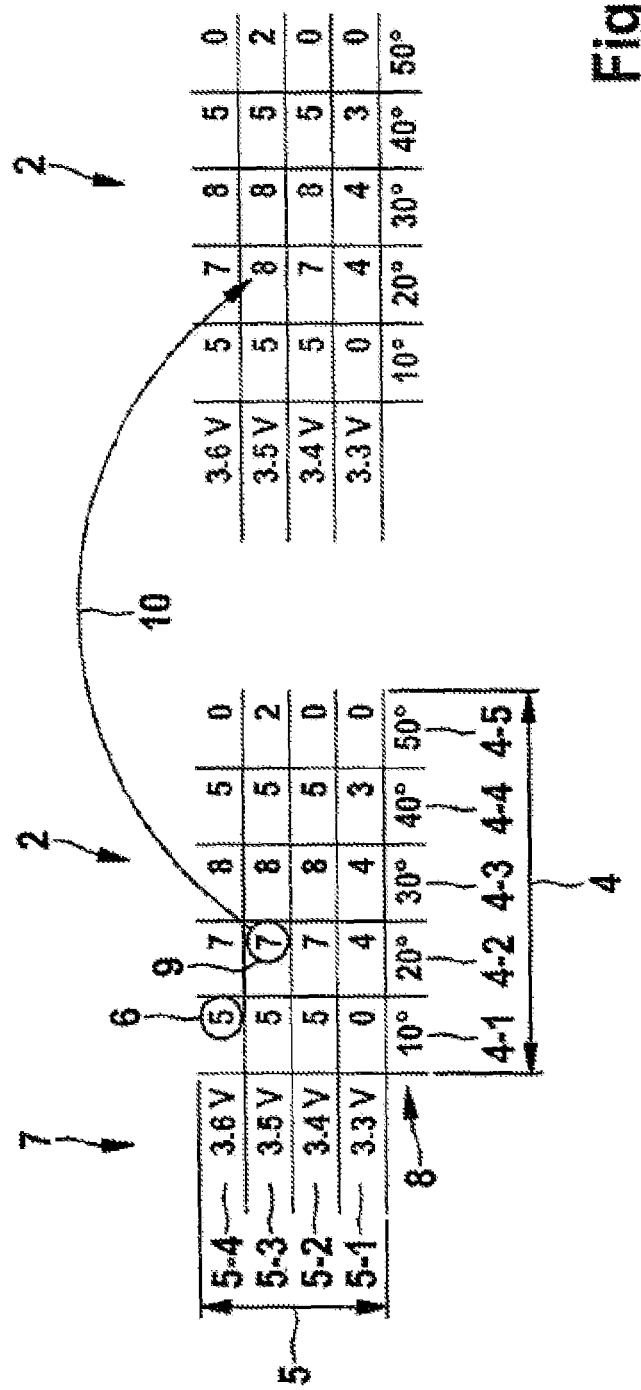
FIG. 1 shows an example for updating of a two-dimensional histogram.

FIG. 1 shows a two-dimensional histogram 2 before and after an updating step which is represented here, for example, as an arrow 10. When the histogram 2 is produced, the temperature and the voltage are determined with a defined detection rate and the corresponding histogram counter is increased by 1. In the example, an update step 10 is represented with an increase of frequency of the measurement 9 "20°/3.5 volts". From the histogram 2 it is apparent, for example, that the battery was operated at 20° C. and 3.5 V voltage after the update step 10 for 8 measurements, or also that the battery was not operated at all at 0° C. The histogram 2 is also referred to as a use histogram within the scope of the disclosure.

In the illustrated example, a total interval 4 of temperatures from −10° C. to +50° C. is divided into 5 individual intervals 4-1, 4-2, . . . 4-5, wherein the individual intervals 4-1, 4-2, . . . 4-5 have here, for example, an interval width of 10° C. The specified temperature values 8 can relate, for example, to the mean values of the values given by the interval boundaries or else to the value of the left-hand or of the right-hand boundary.

In the illustrated example, a total interval 5, which comprises here, for example, voltage values 7 from 3.3 V to 3.6 V, is also divided into 4 individual intervals 5-1, 5-2, . . . 5-4, wherein the individual intervals 5-1, 5-2, . . . 5-4 have here, for example, an interval width of 0.1 V. The specified voltage values 7 can also relate to the mean values of the values which are given by the interval boundaries, or else to the value of the left-hand boundary or of the right-hand boundary.

Figure 2:
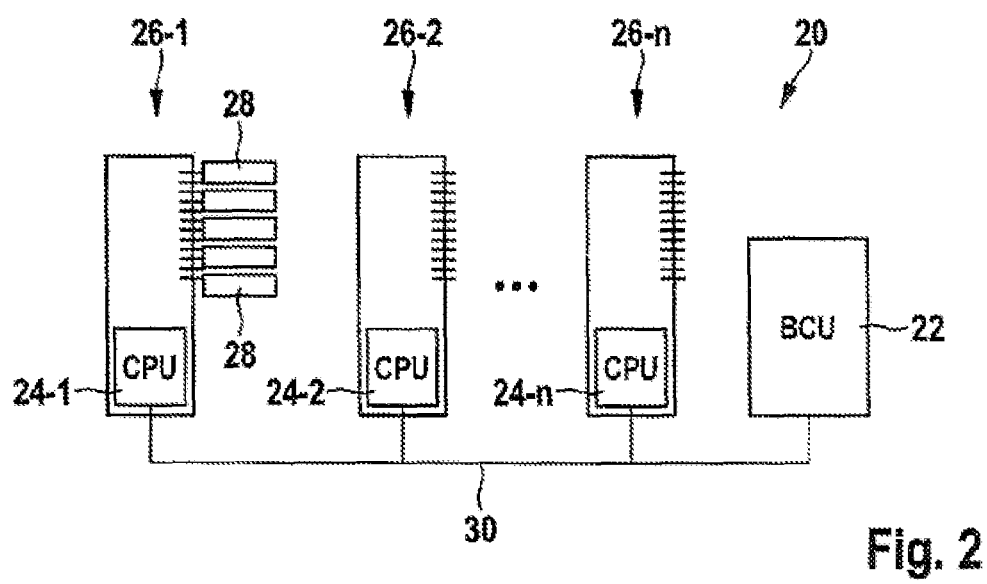
FIG. 2 shows a battery management system according to an embodiment disclosed herein.

FIG. 2 shows a battery management system 20 according to an embodiment of the present disclosure. The battery management system comprises a central control device 22, which can also be referred to as a BCU (Battery Control Unit), and can comprise a number of battery modules 26-1, 26-2, . . . 26-n, which each have separate module control devices 24-1, 24-2, . . . 24-n, which are also referred to as CMC (Cell Module Controller). Each module 26-1, 26-2, . . . 26-n is assigned a plurality of battery cells 28, wherein these are usually connected in series and partially additionally connected in parallel in order to obtain the required power data and energy data with the battery system. The individual battery cells are, for example, lithium-ion batteries with a voltage range from 2.8 to 4.2 V. The communication between the central control device 22 and the module control devices 26-1, 26-2, . . . 26-n is carried out via a communication channel 30, for example via a CAN bus.

Figure 3:
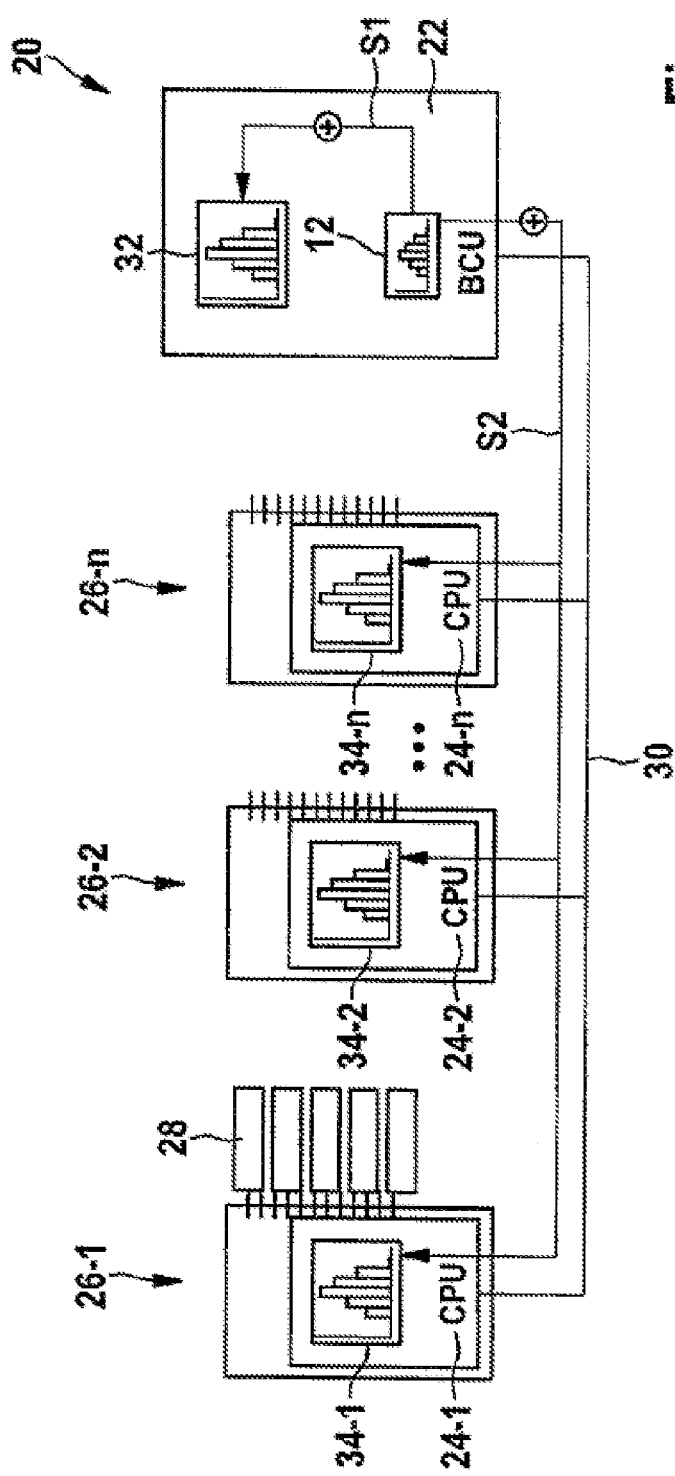
FIG. 3 shows an example of decentralized storage of histograms in a battery management system.

FIG. 3 shows decentralized storage of histograms in a battery management system 20. The battery management system 20 can be constructed as described with reference to FIG. 2 and comprises a central control device 22 and module control devices 24. A suitable detection and quantization module of the central control device detects all the relevant measurement variables and information and produces a current histogram 12 about the use of the battery during the last driving cycle. In a step S1, the current histogram 12 is added to form a total histogram 32 which is stored in a non-volatile memory of the central control device 22.

In addition, the use histogram 12 of the current driving cycle is transferred to the module control devices 24 in a further step S2. In the module control devices 24, the current histogram 12 is added to the use histograms which are stored in a local and decentralized fashion there. The transfer of the current histogram 12 to the individual module control devices 24 can take place via the communication channel 30 or a separate channel.

In the case of damage claims/warranty claims, both the histogram 32 of the central control device 22 and the histograms 34 of the individual modules 26 can be read out in order to evaluate the use for the battery. Even in a case in which individual modules 26 are replaced, the use histogram 32 in the central control device 22 provides information about the use of the total battery pack. In the case of modules 26 being replaced, the use histograms 34 in the modules 26 provide information about the detailed use of the respective module 26. Modules which have been removed can be analyzed individually at the manufacturers without access to the central control device 22 having to take place. There can preferably be provision that newly installed modules 26 only detect useful data starting from the time of installation.

Figure 4:
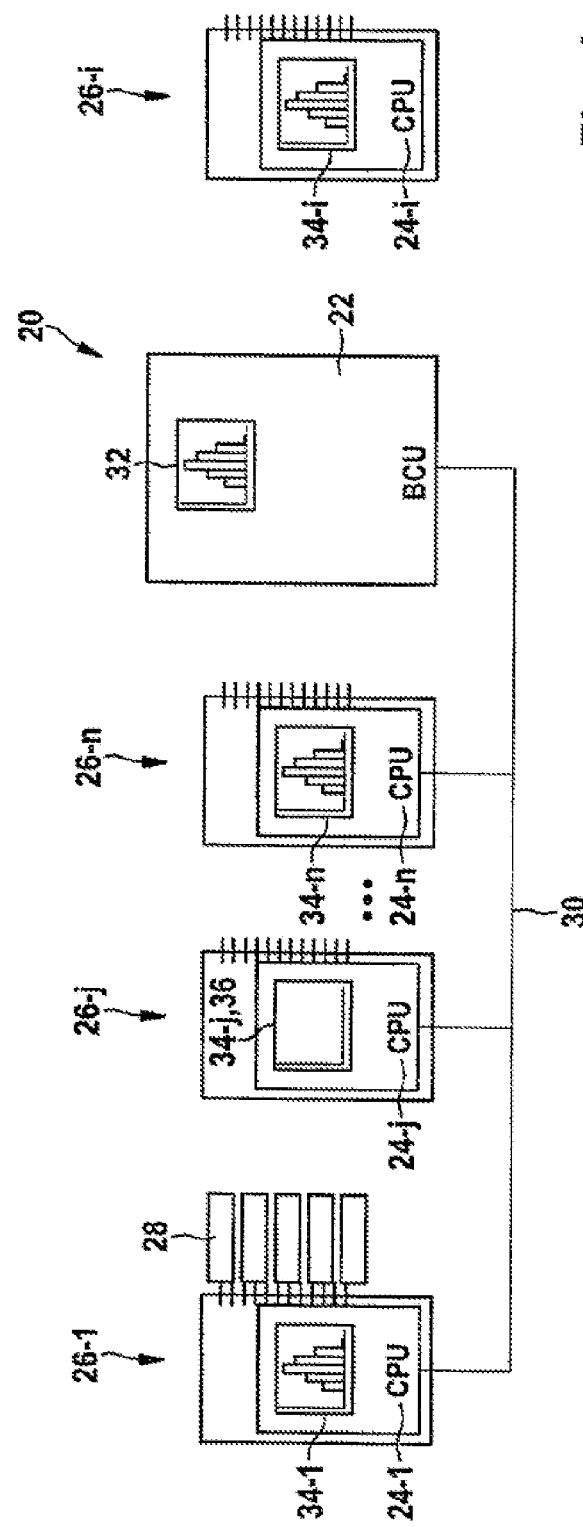
FIG. 4 shows an example of replacement of a module.

FIG. 4 shows an example of replacement of a module in a battery management system 20. The battery management system 20 can be constructed, as described with reference to FIGS. 2 and 3, and comprises a central control device 22 and modules 26 with module control devices 24 and battery cells 28. An old module 26-i was replaced by a new module 26-j which is separate from the communication channel 30. Information about the use of the old module 26-i is present in the form of the stored histogram 34-i in the non-volatile memory of the assigned module control device 24-i for analysis. The new module 26-j is initialized with an empty histogram 36 which is stored in a memory location, which is made available, of the non-volatile memory of the module control device 24-j.

Figure 5:
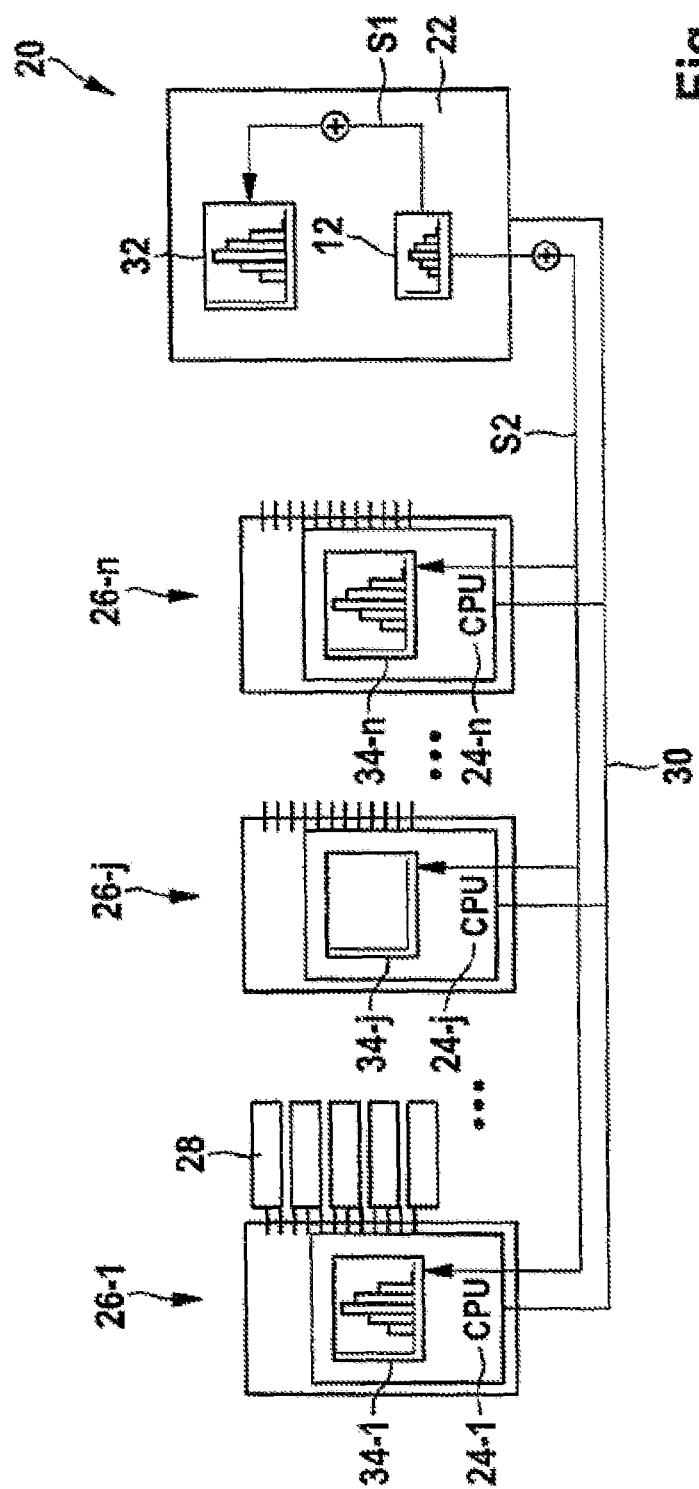
FIG. 5 shows an example of storage of histograms after replacement of a module.

FIG. 5 shows the battery management system 20 which is constructed as described with reference to FIG. 4 and comprises a new battery module 26-j, after a further driving cycle. In a volatile memory of the central control device 22, a use histogram 12 of the current driving cycle was produced and added to the total histogram 32 in the step S1. In the step S2, the current histogram 12 is transferred to the individual module control devices 24. The module control devices 24 then update their locally stored use histograms 34.

Figure 6:
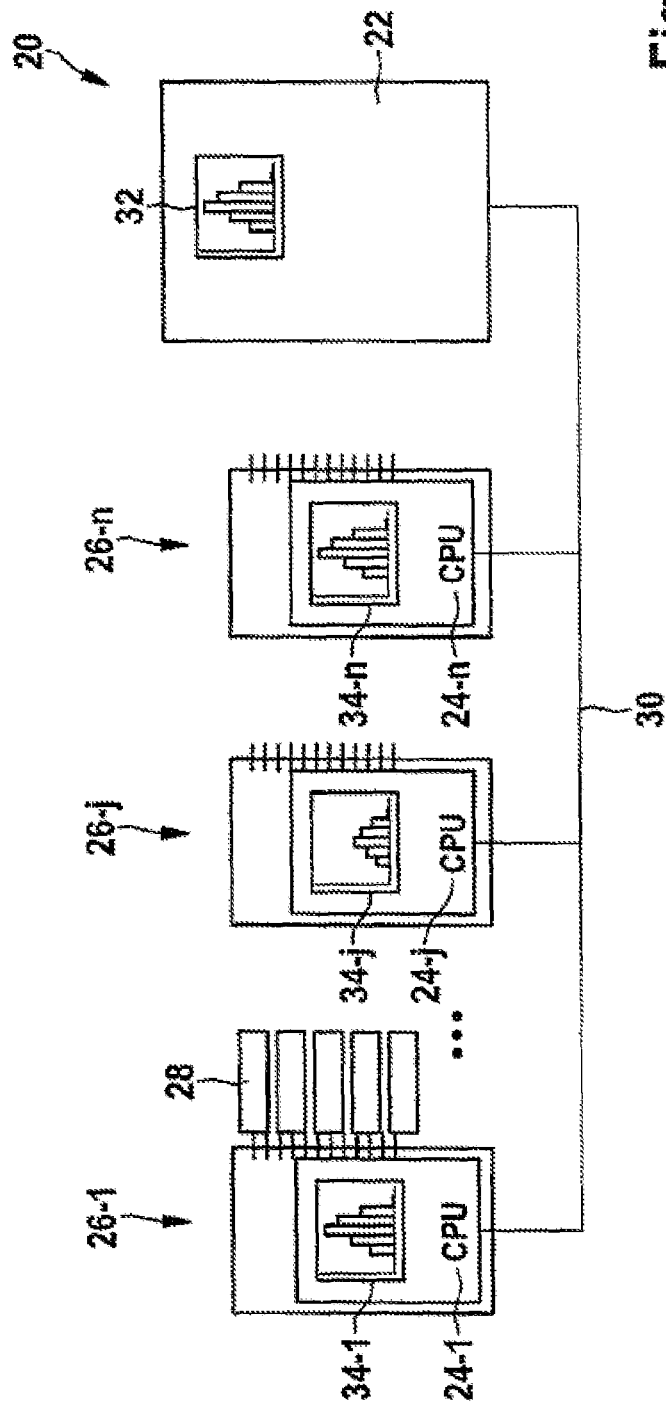
FIG. 6 shows the system from FIG. 5 after the storage process.

FIG. 6 shows the situation from FIG. 5 after storage has taken place. Since the new module 26-j was initialized with an empty histogram, the histogram 34-j stored in the module control device 24-j differs from the further histograms 34-1, 34-n since it has only the values of the last driving cycle.

The disclosure is not limited to the exemplary embodiments described here and the aspects emphasized therein. Instead, within the range specified by the disclosure a multiplicity of refinements which lie within the activity of a person skilled in the art are possible.

What is claimed is:

1. A method for making available information for the purpose of performing maintenance and servicing of a battery having at least one battery module with a module control device and a central control device, wherein the module control device has a non-volatile memory, the method comprising:

detecting and quantizing useful data of battery units;
generating a histogram which has frequency values of the occurrence of specific values of the individual quantized useful data or values derived therefrom;
transferring the histogram from the central control device to the module control device;
loading an existing histogram from the non-volatile memory of the module control device;
combining the histogram received by the central control device and the existing histogram to generate an updated histogram; and
storing the updated histogram in the non-volatile memory of the module control device.

2. The method according to claim 1, further comprising:
storing the updated histogram in a non-volatile memory of the central control device.

3. The method according to claim 1, further comprising:
in response to replacement of an old battery module with a new battery module, initializing the new battery module with an empty histogram.

4. The method according to claim 1, further comprising:
detecting the useful data with a detection rate having a defined value between 6 per second and 6 per hour.

5. The method according to claim 1, wherein the useful data of the battery includes one selected from the group consisting of a temperature, a state of charge, an output current, and a voltage which is made available.

* * * * *